(12) United States Patent
Kuwabara

(10) Patent No.: US 6,973,208 B2
(45) Date of Patent: Dec. 6, 2005

(54) METHOD AND APPARATUS FOR INSPECTION BY PATTERN COMPARISON

(75) Inventor: Masayuki Kuwabara, Hachioji (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 707 days.

(21) Appl. No.: 09/861,084

(22) Filed: May 18, 2001

(65) Prior Publication Data

US 2002/0172411 A1 Nov. 21, 2002

(51) Int. Cl.[7] .............................................. G06K 9/00
(52) U.S. Cl. ..................................... 382/145; 382/144
(58) Field of Search ............................... 382/144, 145, 382/147–149, 194, 219, 318; 348/87, 126; 356/237.4, 237.5, 237.1, 237.2, 237.3

(56) References Cited

U.S. PATENT DOCUMENTS

| 4,805,123 | A | 2/1989 | Specht et al. ................ 382/144 |
| 4,845,558 | A | 7/1989 | Tsai et al. .................... 348/126 |
| 6,222,624 | B1 * | 4/2001 | Yonezawa ................ 356/237.1 |
| 6,456,318 | B1 * | 9/2002 | Noguchi ...................... 348/87 |
| 6,512,843 | B1 * | 1/2003 | Kuwabara ................... 382/149 |
| 6,643,394 | B1 * | 11/2003 | Kuwabara ................... 382/149 |

FOREIGN PATENT DOCUMENTS

| JP | 59-157505 | | 9/1984 | |
| JP | 2000131240 A | * | 5/2000 | .......... G01N 21/88 |

* cited by examiner

Primary Examiner—Vikkram Bali
(74) Attorney, Agent, or Firm—Christie, Parker and Hale, LLP

(57) ABSTRACT

Disclosed are a method and apparatus for inspection by pattern comparison enabling cell-cell comparison by software processing even when the array pitch R of the cells is not a whole multiple of the pixel pitch P, wherein provision is made of an imaging device for capturing an image of patterns having a plurality of basic patterns repeating at a predetermined pitch and generating pixel data, a memory for storing the image data, and an image processor unit for successively comparing corresponding pixel data of the basic patterns based on the pixel data, the image processor unit setting a first whole number by which the length of the predetermined pitch multiplied by the first whole number becomes a whole multiple of the pixel pitch when the predetermined pitch is expressed by a resolution of at least a predetermined resolution pitch smaller than the pixel pitch and successively comparing the corresponding pixel data of basic patterns said first whole number of pattern away.

14 Claims, 6 Drawing Sheets

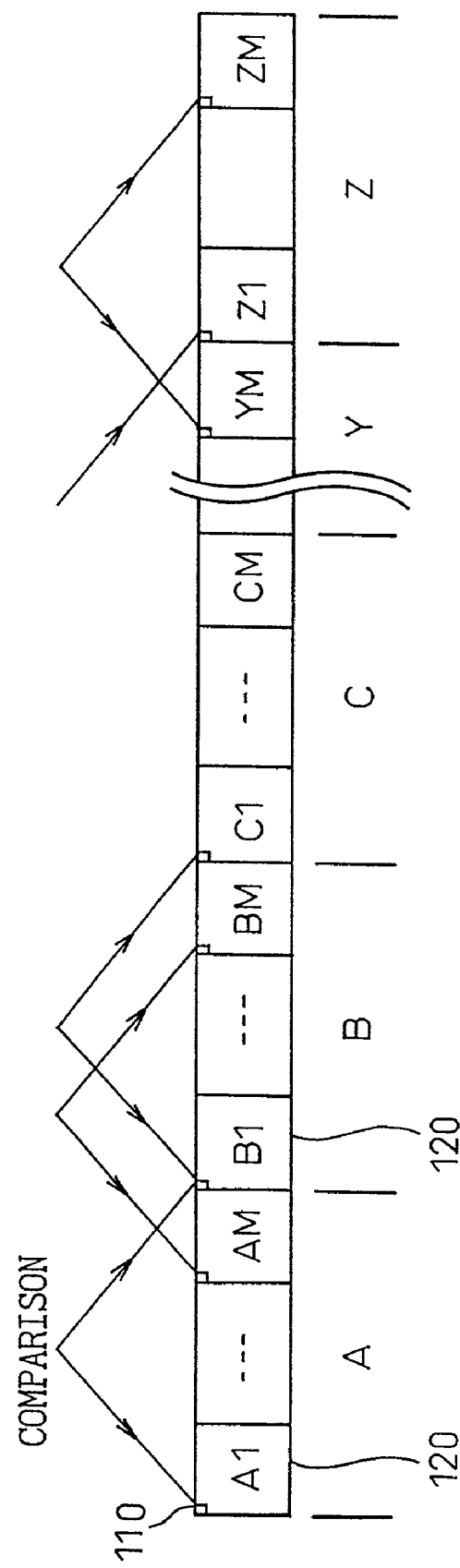

METHOD AND APPARATUS FOR INSPECTION BY PATTERN COMPARISON

BACKGROUND OF THE INVENTION

Field of the Invention

The present invention relates to a method and apparatus for inspection by pattern comparison which compare basic patterns to inspect for defects in patterns having basic patterns repeating at a predetermined pitch, more particularly relates to a method and apparatus for visual inspection which inspect patterns with repeating cell patterns formed on a semiconductor wafer such as semiconductor memories or patterns of a photomask by successively comparing nearby cell patterns.

It is now a widespread practice to capture an image of formed patterns to generate image data and analyze the image data to inspect for defects in the patterns. In particular, in the field of semiconductor fabrication, extensive use is being made of photomask inspection machines for inspecting photomasks and visual inspection machines for inspecting patterns formed on semiconductor wafers. The present invention can be applied to inspection of any such patterns so long as the patterns have repeating basic patterns such as in the case of photomasks or wafer patterns. In the following, however, the explanation will be given taking as an example the image data obtained by optically capturing patterns formed on a wafer.

FIG. 1 shows the state of formation of semiconductor chips 101 on a semiconductor wafer 100. In general, such semiconductor chips 101 are called "dies", so this term will be also used here. In the process of fabrication of a semiconductor device, several layers of patterns are formed on the wafer 100, so a long time is required until the entire process is finished. If there is a serious defect in even one layer, the corresponding die will become defective and the yield will fall. Therefore, the practice is to obtain an image of the patterns formed at an intermediate step, analyze the obtained image data, remove and reform a layer where serious defects occur, or feed back the defect information to the fabrication process to improve the yield. A visual inspection machine is used for this purpose.

FIG. 2 is a view of the general configuration of a visual inspection machine. As shown in FIG. 2, the wafer 100 is held on a stage 11. Illumination light from a light source 14 is condensed by a condenser lens 15 and reflected by a half mirror 13, then passes through an object lens 12 and illuminates the surface of the wafer 100. An optical image of the surface of the illuminated wafer 100 is projected on an imaging device 16 by the object lens 12. The imaging device 16 converts the optical image to an electrical signal, that is, an image signal. The image signal is digitalized to convert it to image data which is then stored in an image memory 17. An image processor unit 18 processes the image data stored in the image memory 17 to investigate if there are any defects. A controller 19 controls the stage 11, image memory 11, image processor unit 18, and other components of the machine.

The patterns of a semiconductor device are extremely fine, so a visual inspection machine is required to have an extremely high resolution. Therefore, a one-dimensional image sensor is used as the imaging device, the stage 11 is moved (made to scan) in one direction, and the output of the imaging device is sampled in synchronization with the scan to obtain the image data. When the width H on the wafer able to be captured is smaller than the width of a die 101, for example, as shown in FIG. 1, the same portion of each die is successively scanned, then after all dies have finished being scanned, the other portions of the dies are successively scanned to obtain the image data of all of the portions of the dies. By scanning to obtain image data and simultaneously comparing with image data of a corresponding portion of another die obtained by the previous scan, the throughput is improved. The method of scanning is however not limited to this. Various methods have been proposed.

FIG. 3 is a view explaining the operation of comparing image data between adjoining dies. The dies A, B, C, and D are arrayed as shown in FIG. 3. The image data is expressed in units of pixels 101. The array pitch of the pixels on the wafer surface in the direction perpendicular to the scan is the array pitch of the pixels of the imaging device multiplied by the reciprocal of the imaging magnification rate. In the case of a one-dimensional image sensor, it is the value of the scanning speed multiplied by the sampling period. As illustrated, when comparing the dies B and C, the image data of corresponding pixels of the dies B and C are compared. For example, the image data of rows a and columns 1 of the dies B and C are compared. Therefore, the positions of the pixels of the dies B and C must correspond. Patterns are formed on the dies by exposure by a single common photomask. They are successively exposed by exposing one die, then moving the wafer to expose the next die. Therefore, the precision of positioning between dies is determined by the precision of positioning of movement. In general, sufficient inspection by comparison requires that the deviation in the compared portions be not more than a half to a tenth of a pixel. Various methods have been proposed to correct deviation by image processing when this requirement cannot be satisfied by just the precision of positioning of movement.

The pixel data between dies are generally compared by generating and storing pixel data successively from the dies at the ends and comparing the newly generated pixel data of a die with the pixel data of a die generated and stored immediately before such as A and B, B and C, and C and D. By comparing the data in this way, the dies at the center, that is, the dies other than the dies at the two ends, are compared twice with the two adjoining dies. If the results of comparison give matches both times, the dies are judged to be normal (no defects). If the results of comparison give no match both times, there is judged to be an abnormality (defect). This method of comparing dies two times and judging the presence of defects by the results of two comparisons is called "double detection". Further, the comparison of dies is called "die—die comparison".

A semiconductor memory etc. is configured by a repetition of basic units called "cells". The patterns for the same also are configured by repetitions of basic patterns corresponding to the cells. FIG. 4 explains a cell. As illustrated, cell areas 120 shown by a length (array pitch) R in the scanning direction and a width S in the direction perpendicular to the scan are arranged repeatedly in two directions. When inspecting patterns of such cells arranged at predetermined pitches, the practice is not to perform such a die—die comparison, but to compare the pixel data of corresponding portions between adjoining cells to judge the presence of defects. This is called "cell—cell comparison".

As shown in FIG. 4, when the pixel pitch is P and R is a whole multiple of P, the pixels of the cell areas 120 can be compared as they are with the pixels of other cell areas so long as their positions in the patterns are the same. In cell—cell comparison as well, in the same way as die—die comparison, adjoining cells are successively compared while shifting the cells one at a time. Therefore, the cells at the center, that is, the cells other than the cells at the two ends, are compared two times with the cells adjoining at the two sides, that is, double detection is performed.

In actuality, however, the array pitch R of cells is not always a whole multiple of the pixel pitch P. FIG. 5 shows the state in this case. Assume that R and P are in the following relationship:

$$R=(K+N/M)P$$

where K, M, and N are whole numbers, 0<N<M, and M and N are the greatest common denominators.

In this case, the patterns of the cells are gradually offset by NP/M with respect to the pixels. Therefore, it is not possible to compare the pixel data as they are. Note that the offset in a pattern allowed in the comparison is limited. This is called here the "resolution pitch". Here, assume that an offset of up to 1/L (L is a whole number) of the pixel pitch is allowed. P/L is then defined as the resolution pitch. Therefore, M≦L.

When the array pitch R is not a whole multiple of the pixel pitch P, adjoining cells cannot be compared. Therefore, in this case, it has been proposed to change the imaging magnification rate or scanning speed or sampling period so that the array pitch R becomes a whole multiple of the pixel pitch P. Hardware becomes necessary for enabling such conditions to be changed, however, so the cost is increased. Alternatively, the problem arises of the throughput declining due to the change in conditions.

SUMMARY OF THE INVENTION

An object of the present invention is to provide a method and apparatus for inspection by pattern comparison which enable cell-cell comparison by software without requiring a change of hardware even when the array pitch R of cells is not a whole multiple of a pixel pitch P.

FIG. 6 is a view explaining the principle of the present invention. As explained above, when the pixel pitch P and the array pitch R are in the relation R=(K+N/M)P (where K, M, and N are whole numbers, 0≦N≦M, M and N are greatest common denominators, and M≦L (resolution pitch)), the pixels of cells separated by a distance of the array pitch R multiplied by M (M separated cells), that is, the pixels separated by MR=(MK+N)P, are deemed to be at the same positions in the patterns. Therefore, it is sufficient to compare these pixels.

That is, the method of inspection by pattern comparison of the present invention is a method of inspection by pattern comparison which performs an inspection by successively comparing corresponding pixel data of a plurality of basic patterns repeating at a predetermined pitch based on pixel data of patterns having said basic patterns, comprising setting a first whole number (M) by which the length of the predetermined pitch multiplied by the first whole number (M) becomes a whole multiple of the pixel pitch when the predetermined pitch is expressed by a resolution of at least a predetermined resolution pitch smaller than the pixel pitch and successively comparing the corresponding pixel data of basic patterns said first whole number (M) of patterns away.

The above formula uses the resolution pitch P/L and has a rounding off error. By comparing pixels separated by MR=(MK+N)P while successively shifting the pairs of pixels compared, however, the error does not accumulate.

The pixel data are compared successively while shifting by one pixel at a time along the direction of repetition of said basic patterns, therefore at a center portion of a string of pixel data in the direction of repetition of the basic patterns excluding the range of the predetermined pitch at the two sides multiplied by the first whole number (M), the comparison is performed by double detection where pixel data is compared with two pixel data at the two sides separated by a length of the predetermined pitch multiplied by the first whole number (M).

In this case, the pixel data in the range of the predetermined pitch at the two sides multiplied by the first whole number (M) other than the center portion are compared only once, but there is no particular problem with just one comparison.

If it is necessary to compare even the pixel data at the two end portions two times as well, the pixel data is compared with another pixel data separated by a length of the predetermined pitch multiplied by the first whole number (M) (MR=(MK+N)P) further multiplied by a whole number of at least 2. In this case, considering the accumulation of error, it is preferable that the pixels be separated by 2MR.

As another method for comparing the pixel data at the two end portions twice, there is the method of setting a second whole number (T) by which the length of said predetermined pitch multiplied by the second whole number (T) becomes a whole multiple of the pixel pitch when the predetermined pitch is expressed by a resolution of a second resolution pitch larger than said predetermined resolution pitch and successively comparing pixel data separated by a length of the predetermined pitch multiplied by the second whole number (T).

Note that the pixel data at the two end portions are compared at the first comparison with pixel data at the center portion inspected by double detection. If the result of comparison with pixel data at the center judged to be free of defects gives a match, there is judged to be no defect, so the second and later comparisons of the peripheral portions may be performed only when there is no match at the first comparison.

BRIEF DESCRIPTION OF THE DRAWINGS

The features and advantages of the present invention will be more clearly understood from the following description taken in conjunction with the accompanying drawings, in which:

FIG. 7 is a view of the array of pixel data of a cell portion in a die in an embodiment of the present invention.

DESCRIPTION OF THE PREFERRED EMBODIMENTS

Figure 1:
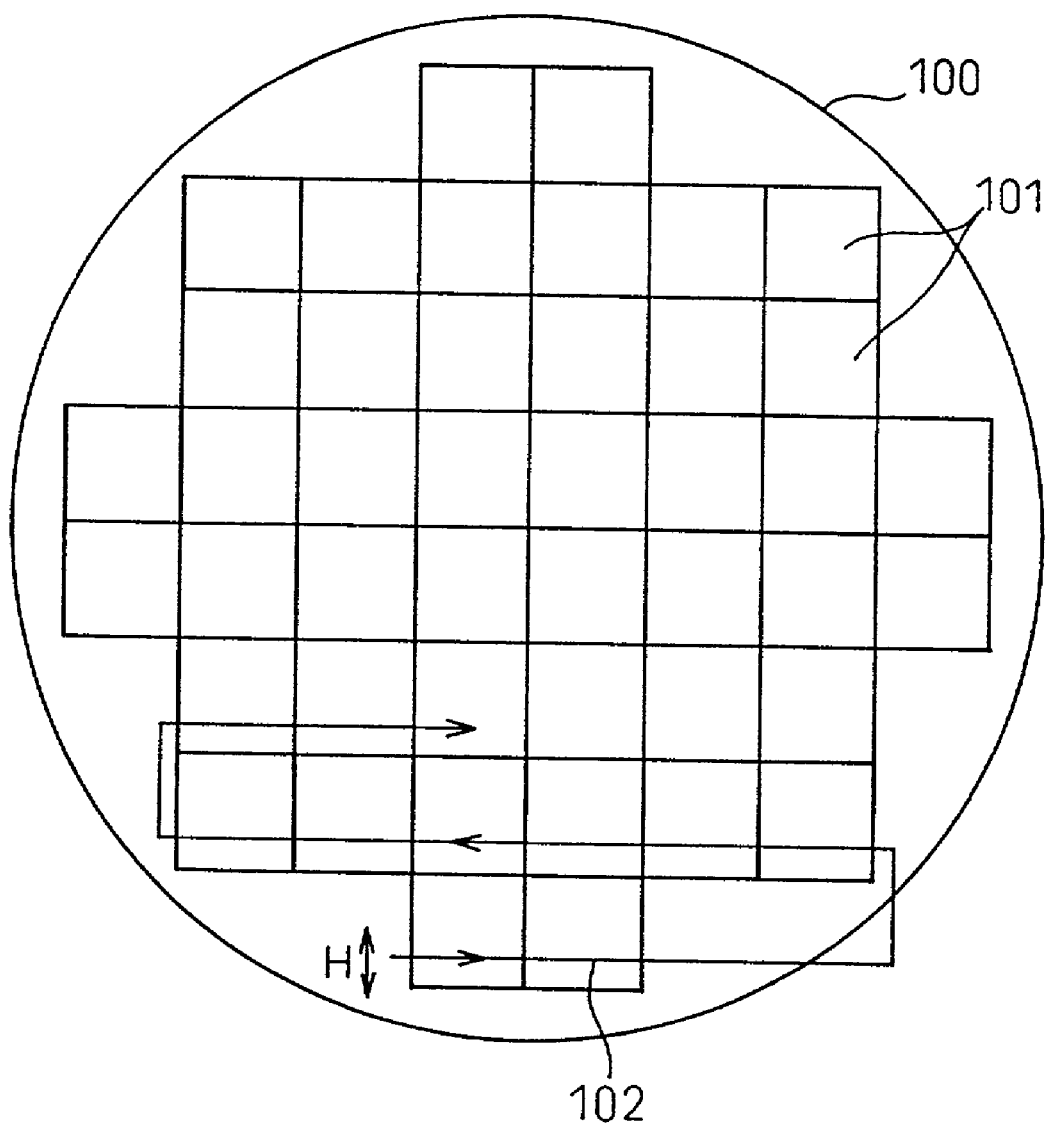
FIG. 1 is a view of an array of semiconductor chips (dies) formed on a semiconductor wafer and the path at the time of inspection.
Figure 2:
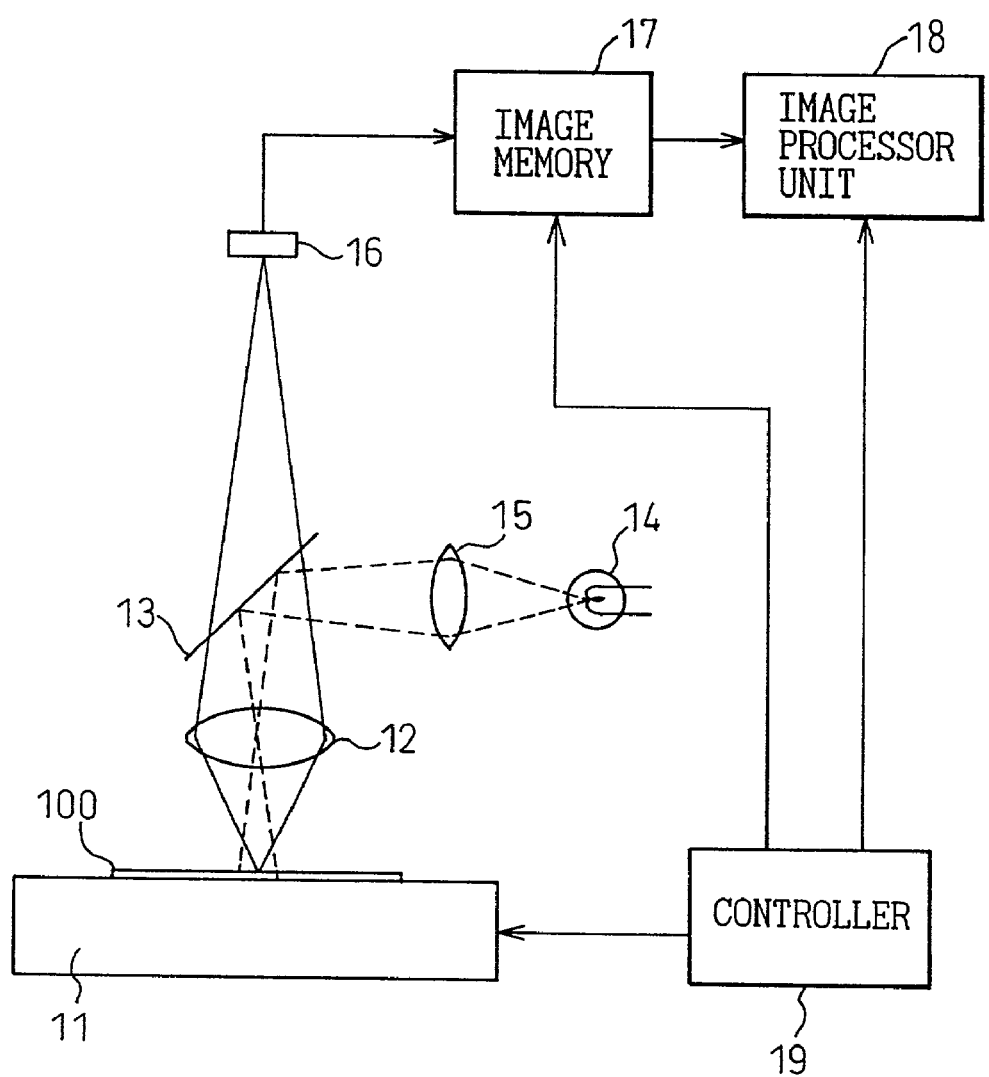
FIG. 2 is a view of the general configuration of a visual inspection machine for inspecting dies formed on a semiconductor wafer.
Figure 3:
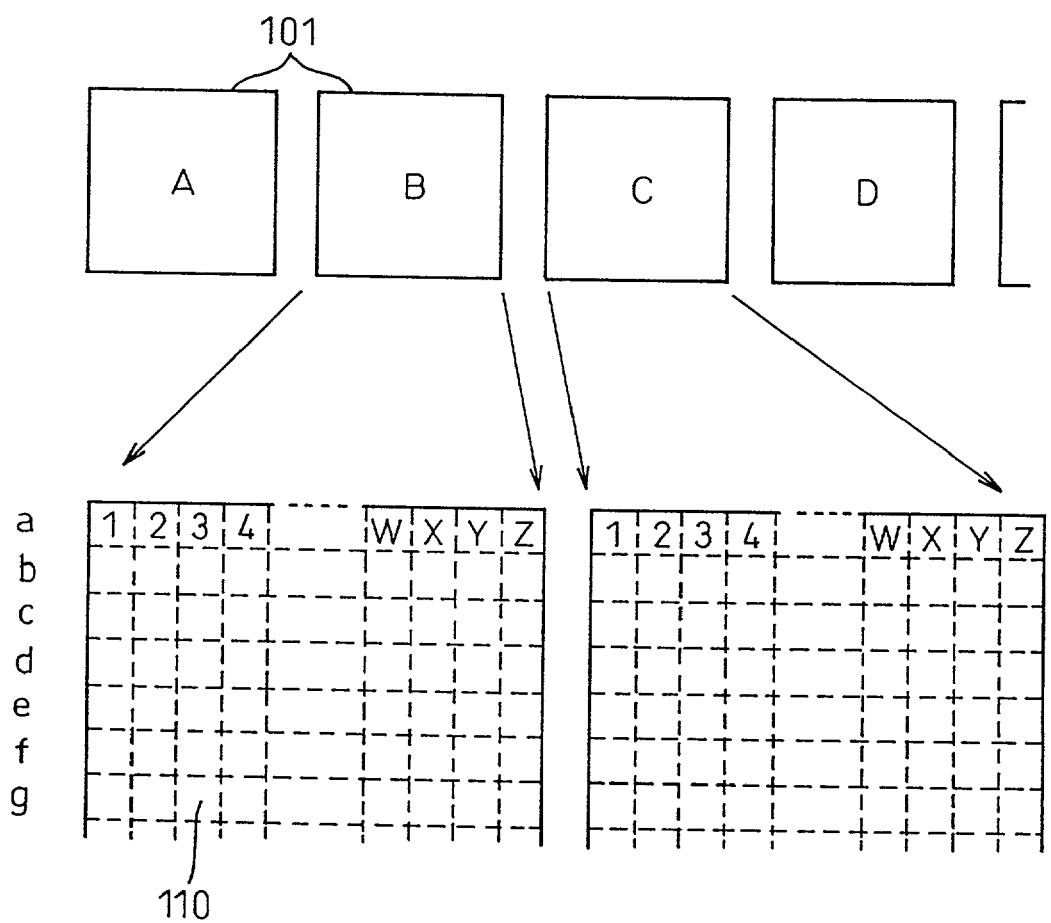
FIG. 3 is a view for explaining die—die comparison.
Figure 4:
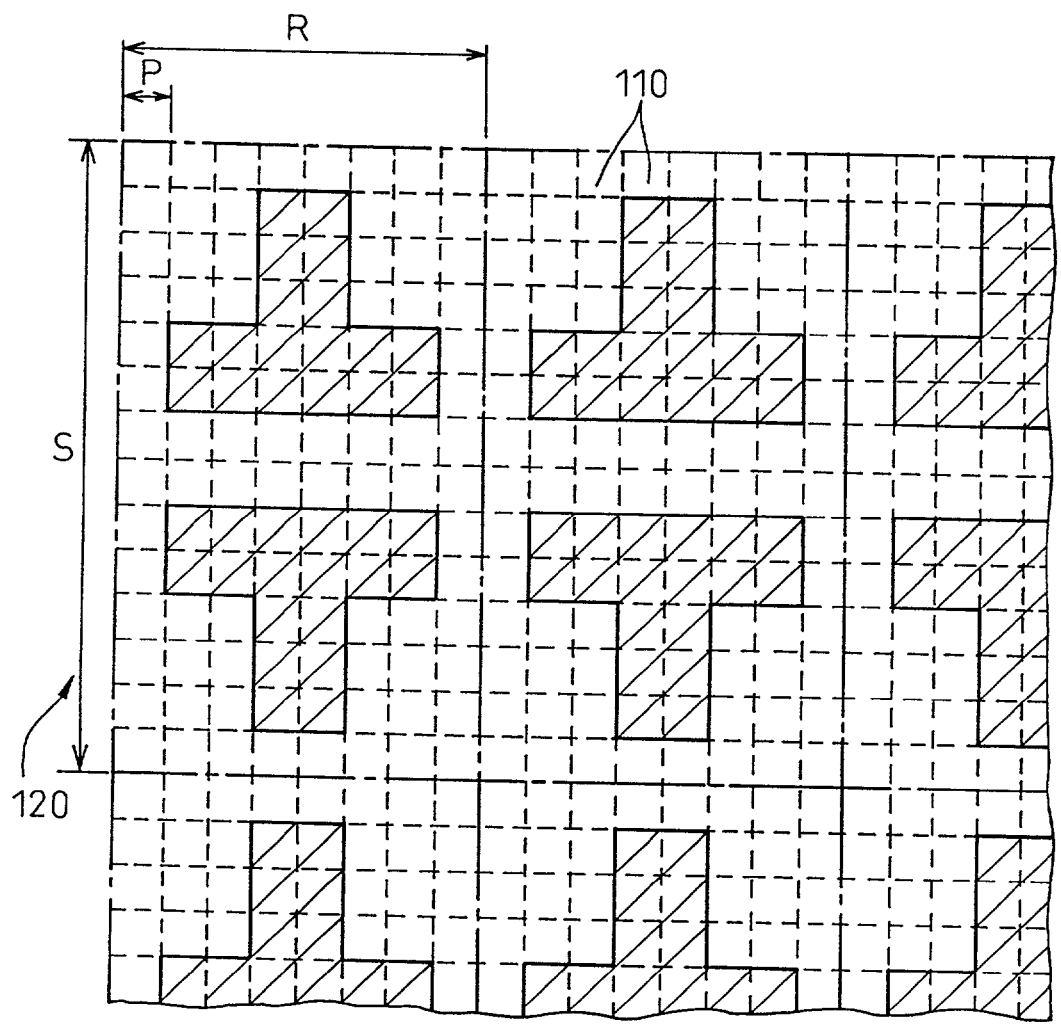
FIG. 4 is a view for explaining an example of a cell and cell—cell comparison.
Figure 5:
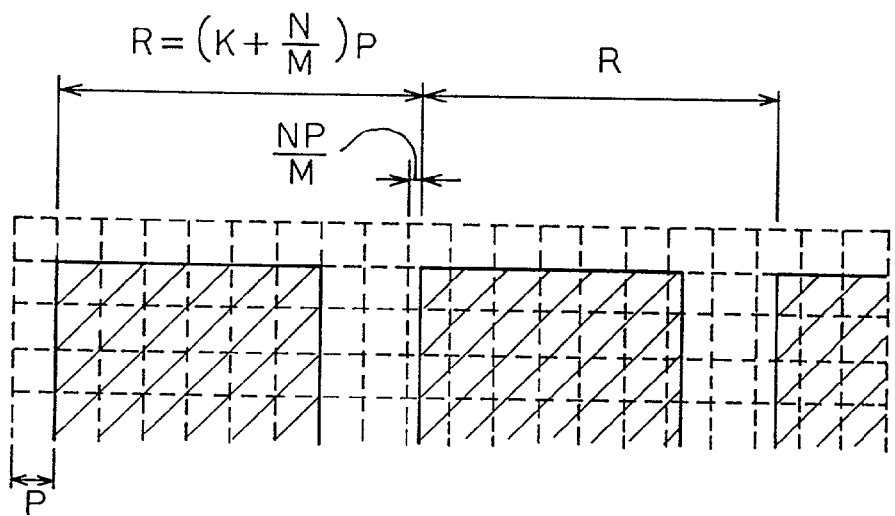
FIG. 5 is a view of the case when the cell pitch is not a whole multiple of the pixel pitch in cell—cell comparison.

Below, the present invention will be explained with reference to an embodiment in the case when inspecting patterns formed on a semiconductor wafer. The general configuration of the inspection machine is similar to that of FIG. 2. It is assumed that a one-dimensional sensor is used and pixel data is obtained by a scan. Further, the patterns formed on the semiconductor wafer are assumed to be patterns of semiconductor memories having cell portions of cells repeatedly arranged at a predetermined pitch.

Figure 6:
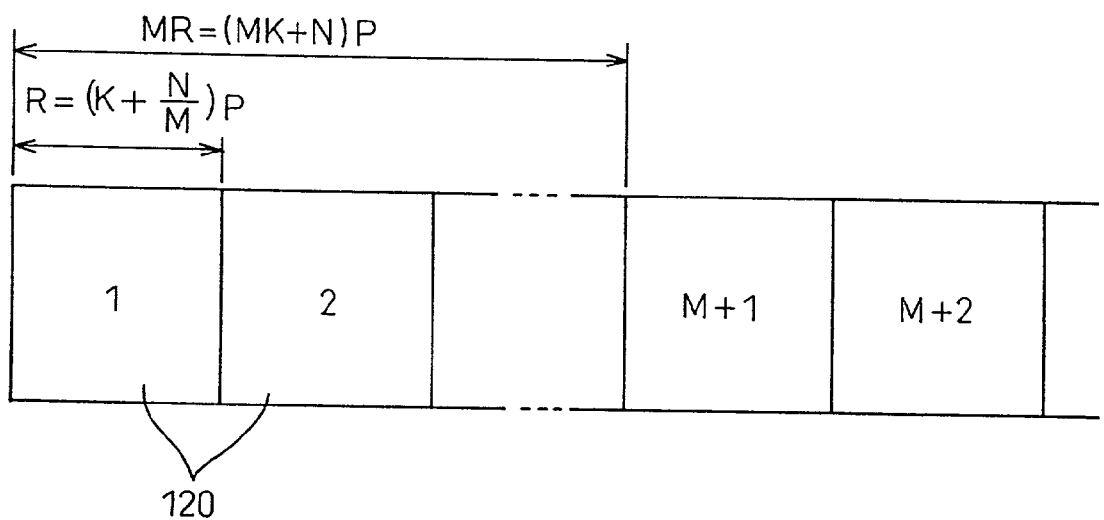
FIG. 6 is a view explaining the principle of the present invention.

FIG. 7 shows the array of pixel data of a cell portion in a die in the present embodiment. In this embodiment, only the cell portions are covered, so die—die comparison is used for the other portions. When the array pitch of pixels in the scanning direction (lateral direction) is P, the array pitch R of the cells is R=(K+N/M)P as shown in FIG. 6. K, M, R, and L (not shown) are as explained above. Here, the array pitch R is set by the operator in the image processor unit 18 based on the design data or imaging conditions, calculated automatically by image processing by the image processor unit 18, or calculated semiautomatically by a combination of these.

Therefore, for the purposes of explanation, as shown in FIG. 7, the pixel data in the range of length of the initial MR in the pixel data of a cell portion is designated as "set A", the pixel data of the range of length of the next MR as "set B", the pixel data of the range of length of the next MR as "set C", the pixel data of the range of length of the last MR as "set Z", and the pixel data of the range of length of the MR before that as "set Y". Each set includes M number of cells.

The image processor unit 18 compares the pixel data 110 of the head of the set A and the pixel data of the head of the set B, then shifts the pixel position one to the right for successive comparison. Note that the pixel data arranged in the direction perpendicular to the scan at this time (longitudinal direction) is similarly compared with the pixel data shifted by the length of MR in the lateral direction. Therefore, the pixel data of the head of the M-th cell of set A and the pixel data of the head of the M-th cell of set B are compared. In this case, since the two compared pixels are exactly MR=(MK+N)P away from each other, they are positioned at the same portions of the patterns of the cells. Therefore, it is sufficient to compare the pixel data as they are. When the result of comparison is not a match, there is a high possibility that one cell includes a defect.

The above comparison is further proceeded with. When the comparison of all pixels of set A and set B is ended, next the pixel data of the head of set B and the pixel data of the head of set C are compared, then the pixel positions are shifted one to the right for successive comparison. Further, when the comparison of all of the pixel data of set Y and set Z ends, the comparison of the cell portion end. Therefore, all of the pixel data from set B to set Y is compared twice with pixel data adjoining at the two sides separated by a length of MR, that is, double detection is performed. As opposed to this, the pixel data of set A and set Z are compared only once with the pixel data of set B and set Y. For pixel data subjected to double detection, when the results of the two detections both give matches, it is judged that the cells are normal (no defects), while when the results of the two detections both do not give matches, it is judged that there is an abnormality (defect). The pixel data of set A and set Z are compared only once, but in fact since the ratio of the pixel data of set A and set Z in the whole is extremely small, there is no particular problem even if they are ignored.

If it is necessary to compare even the pixel data of set A and set Z twice, for example, the pixel data of set A is compared with the pixel data of set C. Further, the pixel data of set Z is compared with the pixel data of the set before set Y. By doing this, since the accumulation of rounding off error by the resolution pitch P/L is small, there is no particular problem. That is, the pixel data of set A and set Z are compared with the pixel data separated by a length of 2MR=2(MK+N)P.

As another method for comparing the pixel data of set A and set B two times, the array pitch R=(K+S/T)P is expressed by a resolution of a second resolution pitch P/U (U<L) larger than the above resolution pitch P/L. At this time, S<T≦U. Further, the pixel data of set A and set Z are compared with the pixel data separated by a length of TR=(TK+S)P.

Note that the processing for comparing the image data of the set A and set Z two times may also be performed only when the result of the first comparison does not give a match. This is because the pixel data of set A and set Z are compared with the pixel data of set B to set Y and if the result of comparison with the pixel data of set B to set Y inspected by the double detection gives a match, it is judged that there is no defect.

Further, the above explanation was given with reference to M≦L, but M=L is also possible.

The above explanation was given with reference to an embodiment of the present invention, but the present invention is not limited to inspection of patterns formed on a semiconductor wafer. It may also be applied to inspection of a photomask, that is, the master pattern of patterns.

Further, the above explanation was given with reference to a configuration generating image data by scanning using a one-dimensional image sensor, but the present invention may also be applied for example to comparison in either direction or both directions when using a two-dimensional image sensor.

As explained above, according to the present invention, even when the array pitch R of cells is not a whole multiple of the pixel pitch P, cell—cell comparison is possible by software processing, so inspection by pattern comparison can be performed at a low cost and in a short time.

I claim:

1. A method of inspection by pattern comparison which performs an inspection by successively comparing corresponding pixel data of a plurality of basic patterns repeating at a predetermined pitch (R) based on pixel data of patterns having said basic patterns, comprising
    setting a first whole number (M) by which the length of the predetermined pitch (R) multiplied by M becomes a whole multiple of the pixel pitch (P) when the predetermined pitch (R) is expressed by a resolution of at least a predetermined resolution pitch smaller than the pixel pitch (P) and
    successively comparing the corresponding pixel data of basic patterns M patterns away,
    wherein R=(K+N/M)×P, where K and N are whole numbers.

2. A method of inspection by pattern comparison as set forth in claim 1, further comprising
    comparing said pixel data successively while shifting by one pixel each along the direction of repetition of said basic patterns and
    comparing a string of pixel data in the direction of repetition of the basic patterns with two pixel data at the two sides separated by a length of the predetermined pitch multiplied by M at a center portion other than a range at the two sides of the predetermined pitch multiplied by M.

3. A method of inspection by pattern comparison as set forth in claim 2, further comprising comparing pixel data in the range at the two sides of the predetermined pitch multiplied by M other than the center portion with only one pixel data at one side separated by the length of the predetermined pitch multiplied by M.

4. A method of inspection by pattern comparison as set forth in claim 2, further comprising first comparing pixel data in the range at the two sides of the predetermined pitch multiplied by M other than the center portion with one pixel data at one side separated by the length of the predetermined pitch multiplied by M, then comparing it with another pixel data separated by a length of the predetermined pitch multiplied by M further multiplied by a whole number of at least 2.

5. A method of inspection by pattern comparison as set forth in claim 2, further comprising
  first comparing pixel data in the range at the two sides of the predetermined pitch multiplied by M other than the center portion with one pixel data at one side separated by the length of the predetermined pitch multiplied by M, then
  setting a second whole number (T) by which the length of said predetermined pitch multiplied by T becomes a whole multiple of the pixel pitch when the predetermined pitch is expressed by a resolution of a second resolution pitch larger than said predetermined resolution pitch, and
  successively comparing pixel data separated by a length of the predetermined pitch multiplied by T.

6. A method of inspection by pattern comparison as set forth in claim 4, further comprising comparing the pixel data in the range at the two sides of the predetermined pitch multiplied by M other than the center portion a second time or more only when the result of the first comparison is not a match.

7. A method of inspection by pattern comparison as set forth in claim 5, further comprising comparing the pixel data in the range at the two sides of the predetermined pitch multiplied by M other than the center portion a second time or more only when the result of the first comparison is not a match.

8. An apparatus for inspection by pattern comparison provided with:
  an imaging device for capturing an image of patterns having a plurality of basic patterns repeating at a predetermined pitch (R) and generating pixel data, a memory for storing the image data, and an image processor unit for successively comparing corresponding pixel data of the basic patterns based on the pixel data,
  the image processor unit
  setting a first whole number (M) by which the length of the predetermined pitch (R) multiplied by M becomes a whole multiple of the pixel pitch (P) when the predetermined pitch (R) is expressed by a resolution of at least a predetermined resolution pitch smaller than the pixel pitch (P) and
  successively comparing the corresponding pixel data of basic patterns M patterns away,
  wherein $R=(K+N/M)\times P$, where K and N are whole numbers.

9. An apparatus for inspection by pattern comparison as set forth in claim 8, wherein said image processor unit further
  compares said pixel data successively while shifting by one pixel each along the direction of repetition of said basic patterns and
  compares a string of pixel data in the direction of repetition of the basic patterns with two pixel data at the two sides separated by a length of the predetermined pitch multiplied by M at a center portion other than a range at the two sides of the predetermined pitch multiplied by M.

10. An apparatus for inspection by pattern comparison as set forth in claim 9, wherein said image processor unit further
  compares pixel data in the range at the two sides of the predetermined pitch multiplied by M other than the center portion with only one pixel data at one side separated by the length of the predetermined pitch multiplied by M.

11. An apparatus for inspection by pattern comparison as set forth in claim 9, wherein said image processor unit further
  first compares pixel data in the range at the two sides of the predetermined pitch multiplied by H other than the center portion with one pixel data at one side separated by the length of the predetermined pitch multiplied by M, then compares it with another pixel data separated by a length of the predetermined pitch multiplied by M further multiplied by a whole number of at least 2.

12. An apparatus for inspection by pattern comparison as set forth in claim 9, wherein said image processor unit further first compares pixel data in the range at the two sides of the predetermined pitch multiplied by M other than the center portion with one pixel data at one side separated by the length of the predetermined pitch multiplied by M, then sets a second whole number (T) by which the length of said predetermined pitch multiplied by T becomes a whole multiple of the pixel pitch when the predetermined pitch is expressed by a resolution of a second resolution pitch larger than said predetermined resolution pitch, and successively compares pixel data separated by a length of the predetermined pitch multiplied by T.

13. An apparatus for inspection by pattern comparison as set forth in claim 11, wherein said image processor unit further compares the pixel data in the range at the two sides of the predetermined pitch multiplied by M other than the center portion a second time or more only when the result of the first comparison is not a match.

14. An apparatus for inspection by pattern comparison as set forth in claim 12, wherein said image processor unit further compares the pixel data in the range at the two sides of the predetermined pitch multiplied by M other than the center portion a second time or more only when the result of the first comparison is not a match.

* * * * *